US012607577B2

(12) United States Patent
Van den Broek

(10) Patent No.: US 12,607,577 B2
(45) Date of Patent: Apr. 21, 2026

(54) AUGMENTATION OF ELECTRON ENERGY LOSS SPECTROSCOPY IN CHARGED PARTICLE MICROSCOPES

(71) Applicant: FEI Company, Hillsboro, CA (US)

(72) Inventor: Wouter René J. Van den Broek, Utrecht (NL)

(73) Assignee: FEI Company, Hillsboro, OR (US)

( * ) Notice: Subject to any disclaimer, the term of this patent is extended or adjusted under 35 U.S.C. 154(b) by 397 days.

(21) Appl. No.: 18/296,854

(22) Filed: Apr. 6, 2023

(65) Prior Publication Data

US 2024/0337610 A1     Oct. 10, 2024

(51) Int. Cl.
*G01N 23/06*          (2018.01)
*G01N 23/04*          (2018.01)
*H01J 37/26*          (2006.01)

(52) U.S. Cl.
CPC ............. *G01N 23/06* (2013.01); *G01N 23/04* (2013.01); *G01N 2223/418* (2013.01); *H01J 37/26* (2013.01); *H01J 2237/24485* (2013.01)

(58) Field of Classification Search
CPC .... H01J 37/26; H01J 37/28; H01J 2237/2802; H01J 2237/24485; G01N 23/04; G01N 23/06; G01N 2223/418
See application file for complete search history.

(56) References Cited

U.S. PATENT DOCUMENTS

| | | | | | |
|---|---|---|---|---|---|
| 6,584,413 | B1 * | 6/2003 | Keenan | ..................... | G01J 3/28 |
| | | | | | 702/194 |
| 6,675,106 | B1 * | 1/2004 | Keenan | ..................... | G01J 3/28 |
| | | | | | 702/194 |
| 11,875,430 | B2 * | 1/2024 | Maltz | ........................ | G06T 5/50 |
| 2006/0011836 | A1 * | 1/2006 | Kaji | ..................... | H01J 37/256 |
| | | | | | 250/311 |
| 2008/0027676 | A1 | 1/2008 | Statham et al. | | |
| 2010/0108883 | A1 * | 5/2010 | Zewail | ..................... | H01J 37/26 |
| | | | | | 250/307 |
| 2018/0240639 | A1 * | 8/2018 | Trevor | ..................... | H01J 37/28 |
| 2023/0179885 | A1 * | 6/2023 | Keizer | .................. | H01J 37/263 |
| | | | | | 348/80 |
| 2023/0402250 | A1 * | 12/2023 | Cattaneo | ............... | H01J 37/244 |

OTHER PUBLICATIONS

Cueva, Paul, et al. "Data Processing For Atomic Resolution EELS." arXiv preprint arXiv: 1112.3059 (Year: 2011).*

* cited by examiner

*Primary Examiner* — Wyatt A Stoffa
(74) *Attorney, Agent, or Firm* — Leron Vandsburger

(57)          ABSTRACT

Systems and techniques for processing electron energy loss spectrum (EELS) data are described. A method for processing EELS data can include receiving spectrum data. The spectrum data can be structured as an array of EELS spectra associated with a spatial region of a material sample. The method can include generating a reference spectrum using the spectrum data. The method can include generating a sample spectrum using the reference spectrum and the spectrum data. The sample spectrum can include a weighted average spectrum. The method can also include outputting the sample spectrum.

20 Claims, 6 Drawing Sheets

AUGMENTATION OF ELECTRON ENERGY LOSS SPECTROSCOPY IN CHARGED PARTICLE MICROSCOPES

TECHNICAL FIELD

Embodiments of the present disclosure are directed to charged particle microscope systems, as well as algorithms and methods for their operation. In particular, some embodiments are directed toward techniques for electron energy loss spectroscopy.

BACKGROUND

Electron energy loss spectroscopy (EELS) describes techniques whereby information about the electronic structure of a material sample can be derived by passing a beam of electrons through the sample, scattering a portion of the electrons. Focusing the beam onto the sample permits EELS data to be spatially resolved on the atomic scale. EELS spectrometers operate by selecting inelastically scattered electrons downstream of the sample, relative to the position of a source of electrons and dispersing the scattered electrons spatially by energy. The spatially dispersed electrons impinge on a detector that generates an EELS spectrum.

EELS spectra typically contain significant background, which can de-emphasize the signatures of trace elements, as when EELS data are averaged using typical spectrum processing techniques (e.g., by taking a regular average over a region of the sample). As a result, processing of EELS data relies on user interaction to select regions of the sample that present edges of interest, making EELS a process that cannot be automated effectively or performed by users who lack expertise in the technique. In energy dispersive spectroscopy (EDS), techniques such as maximum pixel spectrum are applied to the same problem. Maximum pixel spectrum techniques are inapplicable to EELS, however, due to significant non-linearity of the technique and relatively heavy background content in EELS spectra. There is a need, therefore, for techniques for processing EELS data to reveal signatures of trace elements that are attenuated or even invisible in the average spectrum taken over the whole region.

BRIEF SUMMARY

In an aspect, a computer-implemented method for processing electron energy loss spectrum (EELS) data includes receiving spectrum data. The spectrum data can be structured as an array of EELS spectra associated with a spatial region of a material sample. The method can include generating a reference spectrum using the spectrum data. The method can include generating a sample spectrum using the reference spectrum and the spectrum data. The sample spectrum can include a weighted average spectrum. The method can also include outputting the sample spectrum.

In some aspects, generating the reference spectrum includes fitting a smooth background model to at least a subset of the spectrum data. Generating the reference spectrum can include generating an average spectrum of the subset of the spectrum data and fitting the smooth background model to the average spectrum. Generating the reference spectrum can include fitting the smooth background model to an EELS spectrum of the spectrum data. The smooth background model can include a sum of multiple power law terms. Each power law term of the multiple power law terms can include a respective coefficient and a respective exponent. The respective coefficient can be a fitting parameter, and the respective exponent can be a constant.

In some aspects, generating the sample spectrum can include generating respective weight parameters for at least a subset of the EELS spectra and generating the weighted average spectrum using the respective weight parameters. Generating the respective weight parameters can include determining respective divergence extents for the subset of the EELS spectra using the reference spectrum. Determining the respective divergence extents can include determining respective Kullback-Leibler divergence values or respective Jensen-Shannon divergence values for the subset of the EELS spectra.

In some aspects, outputting the sample spectrum includes generating visualization data using the sample spectrum. The visualization data can be configured to modify a display of a computing device to present the sample spectrum as part of an interactive user environment. Outputting the sample spectrum can also include modifying the display using the visualization data. Outputting the spectrum data and/or the sample spectrum can include storing the spectrum data and/or the sample spectrum.

In an aspect, a system is operably coupled to one or more non-transitory machine-readable storage media, storing instructions that, when executed by a machine, cause the system to perform operations of the methods of the preceding aspect. The system can include a charged particle microscope. The charged particle microscope can be a transmission electron microscope coupled with an EELS spectrometer. The charged particle microscope can be coupled with a client computing device including a display and one or more user input components. The operations can include generating the spectrum data using the charged particle microscope. The operations can also include storing the spectrum data.

The terms and expressions which have been employed are used as terms of description and not of limitation, and there is no intention in the use of such terms and expressions of excluding any equivalents of the features shown and described or portions thereof, but it is recognized that various modifications are possible within the scope of the claimed subject matter. Thus, it should be understood that although the present claimed subject matter has been specifically disclosed by embodiments and optional features, modification and variation of the concepts herein disclosed can be resorted to by those skilled in the art, and that such modifications and variations are considered to be within the scope of this disclosure as defined by the appended claims.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

Figure 1:
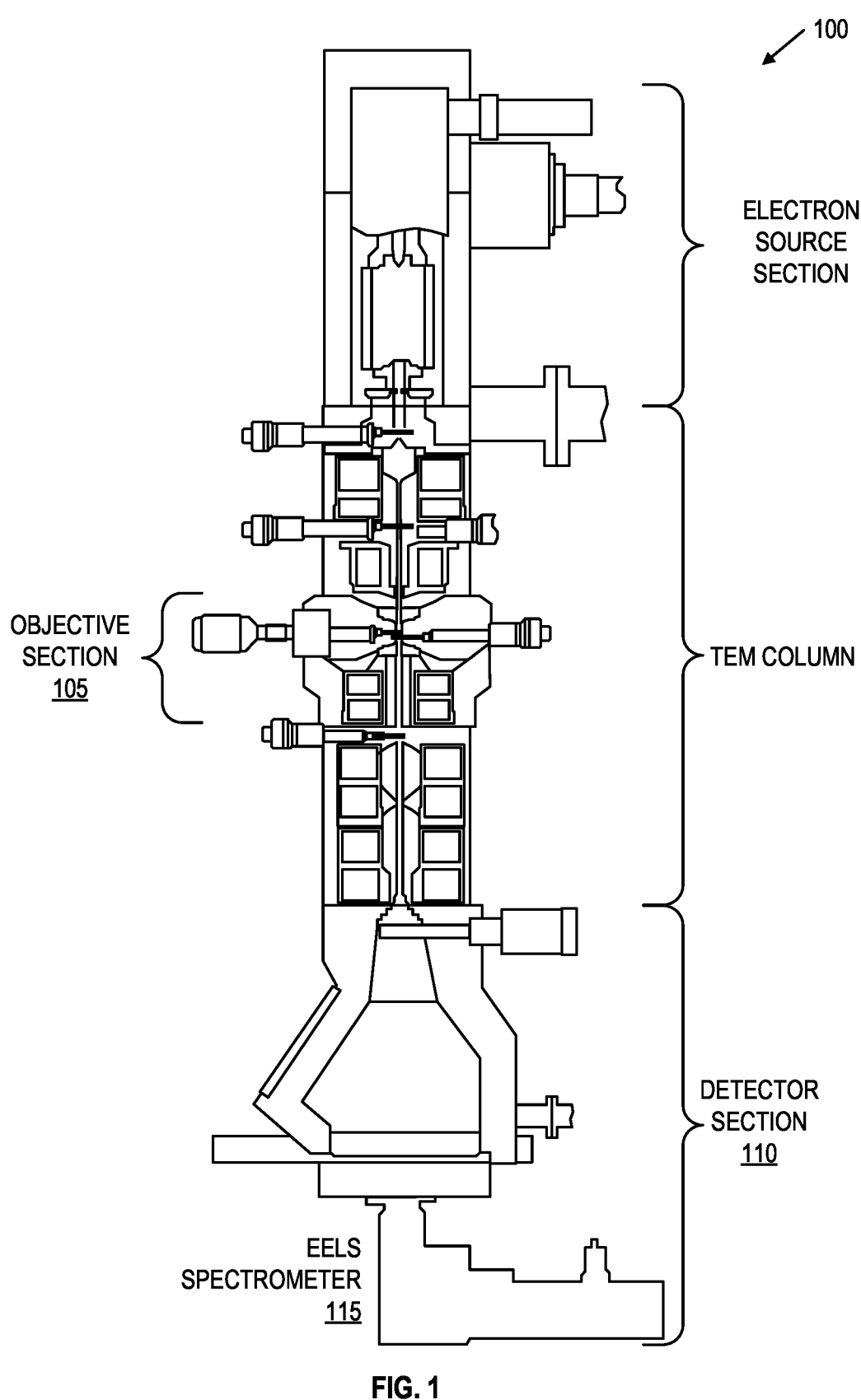
FIG. 1 is a schematic diagram illustrating an example charge particle microscope system, in accordance with some embodiments of the present disclosure.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

While illustrative embodiments have been illustrated and described, it will be appreciated that various changes can be made therein without departing from the spirit and scope of the disclosure. In the forthcoming paragraphs, embodiments of a charged particle microscope system, components, and methods for electron energy loss spectroscopy (EELS). Embodiments of the present disclosure focus on sample microanalysis using EELS-equipped transmission electron microscope (TEM) systems in the interest of simplicity of description. To that end, embodiments are not limited to such systems, but rather are contemplated for systems where analysis of trace elements can be complicated by the relative dominance of background information. In an illustrative example, scanning electron microscope (SEM) systems can be used for EELS analysis in scanning-transmission (STEM) modes. Similarly, systems can be configured specifically for EELS techniques, omitting typical components of TEM systems adapted for imaging, x-ray microanalysis, or the like. As such, while embodiments of the present disclosure focus on TEM platforms equipped with systems for generating and processing EELS data, additional and/or alternative systems and approaches are contemplated, including but not limited to synchrotron spectroscopy or other spectroscopy platforms.

Embodiments of the present disclosure include systems, methods, algorithms, and non-transitory media storing computer-readable instructions for processing EELS data. In an illustrative example, a method can include generating and/or receiving EELS spectrum data for a material sample, which can be structured as one or more data cubes. In the context of the present disclosure, a "data cube" or spectrum image refers to data arrays that can include hierarchically organized spectra including, but not limited to, spatially referenced spectra, temporally referenced spectra, energy referenced spectra, etc. The method can include generating one or more reference spectra using the EELS spectrum data. Using the reference spectrum or spectra, the method can include generating one or more sample spectra for the material sample that can describe respective spatial regions of the material sample, the sample spectra representing a weighted average of the corresponding EELS data cube for the spatial region of the material sample. Where the EELS platform is coupled with one or more computers and/or networks, the method can also include outputting the sample spectrum or spectra. Advantageously, techniques of the present disclosure increase the relative prominence of trace element edges in EELS spectra, reduce the influence of background information, and reduce and/or eliminate the introduction of edge artifacts typical of both linear and non-linear techniques. In this way, the techniques of the present disclosure improve the overall performance of EELS platforms, reduce the complexity of EELS spectrum processing, and facilitate automation (e.g., operation without human intervention) of EELs platforms.

The following detailed description focuses on embodiments of TEM microscopy and microanalysis platforms, but it is contemplated that additional and/or alternative systems can be improved through the use of the techniques described. In an illustrative example, instrument systems can include charged particle instruments configured to generate analytical spectrum data (e.g., mass spectrometry, emission spectrometry, absorption spectrometry, nuclear magnetic resonance spectrometry, Raman spectrometry, infrared spectrometry, hyperspectral imaging, electrochemical spectrometry, x-ray spectrometry, chromatography, or the like).

FIG. 1 is a schematic diagram illustrating an example charge particle microscope system 100, in accordance with some embodiments of the present disclosure. In the following description, details of internal components and functions of the example TEM system 100 are omitted for simplicity and to focus description on embodiments of the present disclosure, as described in more detail in reference to FIGS. 2-5B, and on techniques for augmenting sample information in spectra including relatively strong background information. The example TEM system 100 includes an electron source section, a TEM column including an objective section 105, and a detector section 110. The present disclosure focuses on techniques for improving the performance of the detector section 110, with attention paid to embodiments of the present disclosure that include one or more electron energy loss spectroscopy (EELS) spectrometers 115.

In brief, the electron source section includes electronics configured to energize an electron source, which can include a high-voltage field-emission source or other sources of emitted electrons, such that a beam of electrons is formed and conducted through a vacuum into the TEM column. The TEM column includes components for beam forming, including electromagnetic lenses and electrostatic lenses and multiple apertures to control properties of the beam of electrons. TEM column components include condenser lenses, objective lenses, projector lenses, among others, as well as corresponding apertures. The objective section 105 hosts a sample through which the beam of electrons passes. In the case of EELS microanalysis, the beam can be focused onto the sample for spot mode analysis (e.g., through the action of one or more objective lenses) or the beam can be passed through the sample in parallel illumination mode to gather data from a relatively large sample area.

The detector section 110 includes one or more type of detector, sensor, screen, and/or optics configured to generate images, spectra, and other data for use in sample imaging and/or microanalysis. For example, the imaging section can include a scintillator screen, binoculars, transmission electron microscopy (TEM) detector(s) (e.g., pixelated electron detector, secondary electron detector, camera(s), and electron energy loss spectroscopy (EELS) spectrometer(s) 115, among others. The EELS spectrometer 115 functions as an energy filter at least in part by focusing the beam of electrons onto a magnetic dispersive element (also referred to as a "prism") that applies a force on an electron that is proportional to the energy of the electron. In this way, electrons that have transferred energy to the sample (e.g., by elastic or inelastic collision(s)) can be redirected through the magnetic dispersive element and toward a detector. The detector can include a pixelated detector (e.g., a CCD device configured to detect electrons) that generates two dimensional EELS data and/or one dimensional EELS data, from which EELS spectra can be derived. In some embodiments, EELS spectrometer(s) 115 also include one or more optical elements, such as electromagnetic lenses and/or accelerators, to condition and/or focus the scattered electrons onto the detector.

Figure 2:
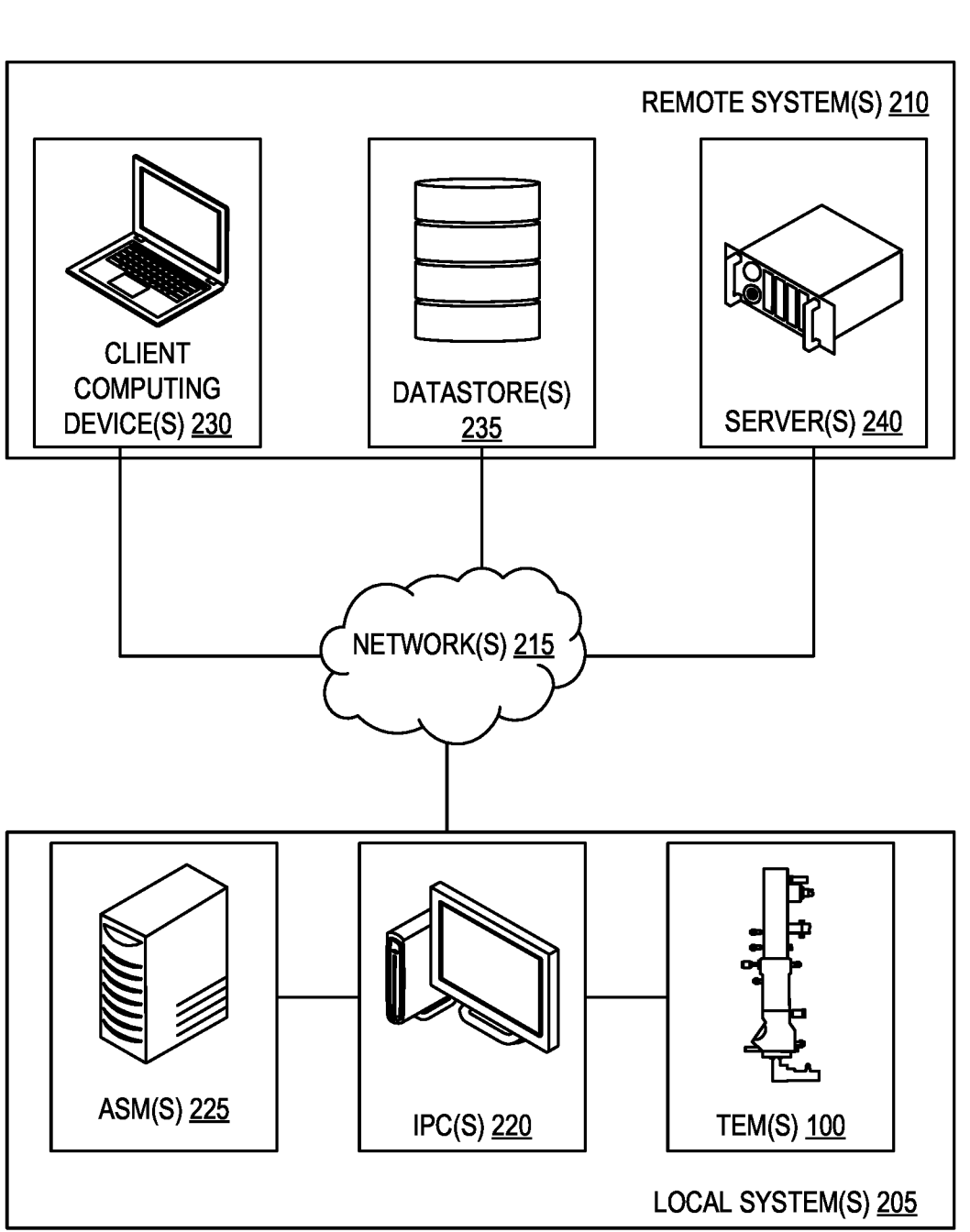
FIG. 2 is a schematic diagram illustrating an example system for processing electron energy loss spectroscopy (EELS) data, in accordance with some embodiments of the present disclosure.

FIG. 2 is a schematic diagram illustrating an example system 200 for processing electron energy loss spectroscopy (EELS) data, in accordance with some embodiments of the present disclosure. The example system 200 includes one or more local systems 205 and one or more remote systems 210, being in communication via one or more networks 215. Local system(s) 205 include one or more instrument PCs (IPCs) 220 and/or one or more application specific machines 225. Remote system(s) 210 include one or more client computing devices 230, one or more datastores 235, and/or one or more servers 240. Constituent elements of local system(s) 205 can be electronically coupled, for example, via a local area network, intranet, near-field communication link, or via network(s) 215. Similarly, constituent elements of remote system(s) 210 can be electronically coupled. In this way, a component of the remote system 210, such as the client computing device 230, can communicate with one or more ASMs 225 or IPCs 220 as part of generating, storing, transferring, and/or processing EELS data, as described in reference to FIGS. 3-5B.

Figure 4:
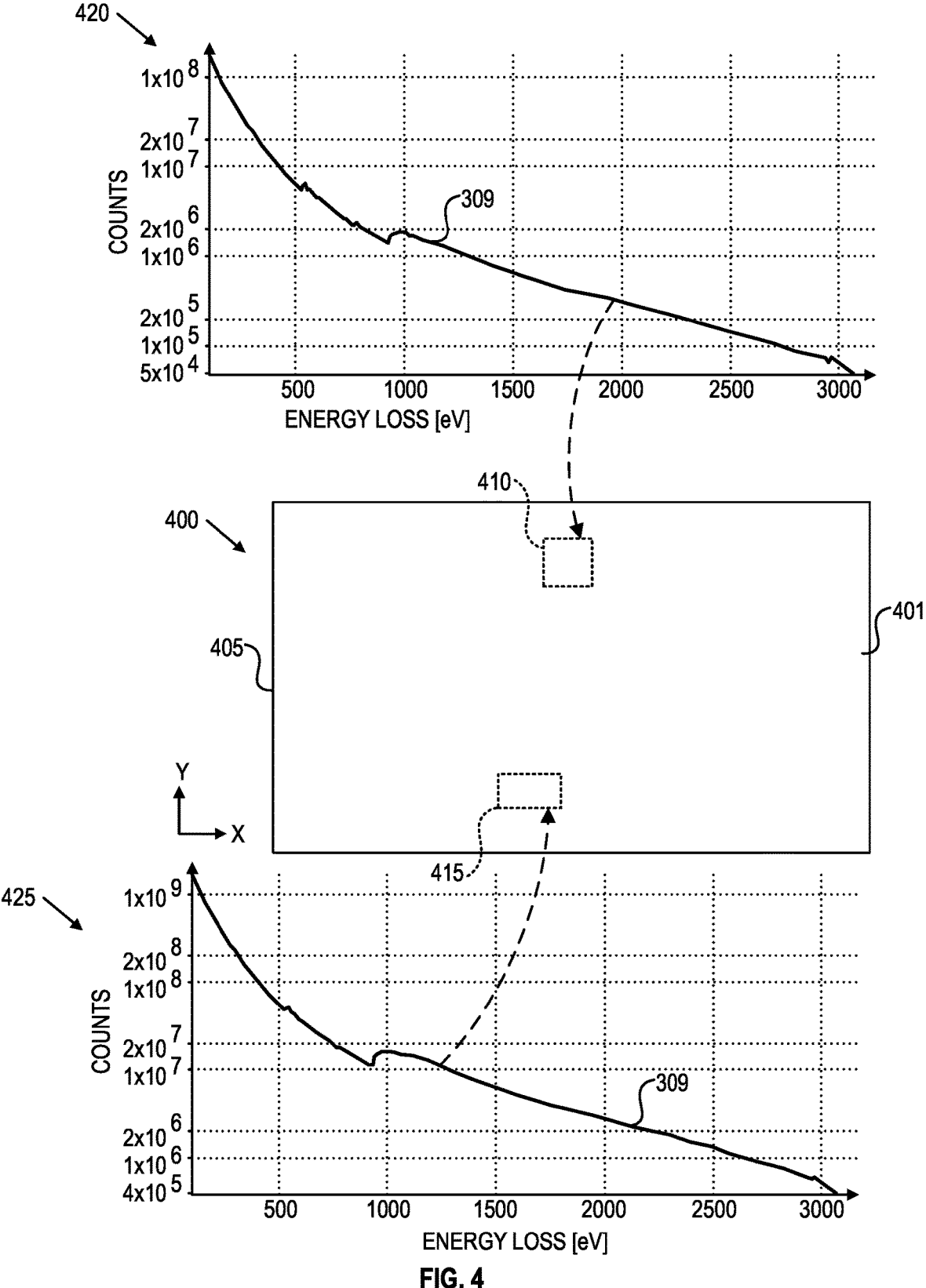
FIG. 4 is a schematic diagram illustrating an example EELS data cube, in accordance with some embodiments of the present disclosure.

EELS data can be structured as spectrum images, referring to a mapping of one dimensional, two dimensional, or three dimensional EELS spectra to electron microscope images, referenced to a physical position on a sample surface, as described in more detail in reference to FIG. 4. In this way, EELS data are typically stored as four-dimensional arrays, with each element in a two-dimensional matrix being associated with an intensity value corresponding to an image of the sample, and a spectrum generated by the EELS spectrometer 115. Based at least in part on the resolution and magnification parameters of the TEM system 100, each element in the two-dimensional matrix can correspond to a region of the sample. For example, in EELS microanalysis, EELS data can be generated with atomic resolution, probing regions of a sample on the order of 1-1000 nm wide.

In the context of the present disclosure, client computing device(s) 230 and IPCs 220 include consumer electronic devices, such as laptops, smartphones, tablets, desktops, terminals, or other devices provided with input/output hardware and interface software. In this way, a user of the example system 200 can access, transfer, output, and otherwise process EELS data, using components of the example system 200 via one or more interactions with a client computing device 230. Similarly, a user can access EELS data using an IPC 220. As part of a distributed computing system, processing operations and/or sub-operations applied to an EELS data cube can be implemented locally or remotely. For example, EELS data can be stored the datastore(s) 235, which can be or include a distributed storage system (e.g., a "cloud"), such that processing operations described in reference to FIGS. 3-5B can be implemented via a remote instance hosted on server(s) 240 that is called via a terminal on client computing device(s) 230 and/or IPCs 220. In another example, client computing device(s) 230 and/or server(s) 240 can communicate with application specific machine(s) 225 to implement one or more processing operations, such as assembling data cubes from one or more samples into an EELS dataset and transferring the dataset to the remote system 210.

In contrast to client computing devices 230 and IPCs 220, ASM(s) 225 can include specialized computing devices configured to coordinate the operations and/or data processing and transfer aspects of one or more IPCs 220 and/or TEM(s) 100. In an illustrative example, an ASM 225 can include a computing device that lacks user interface peripherals, such as a display, keyboard, mouse, etc., and that is specially configured for data transfer and processing operations (e.g., with greater compute resources and/or communications resources). Servers 240, in the context of the present disclosure, refers to networked computer systems (such as rack mounted computers) configured for machine-to-machine communication and processing.

Figure 3:
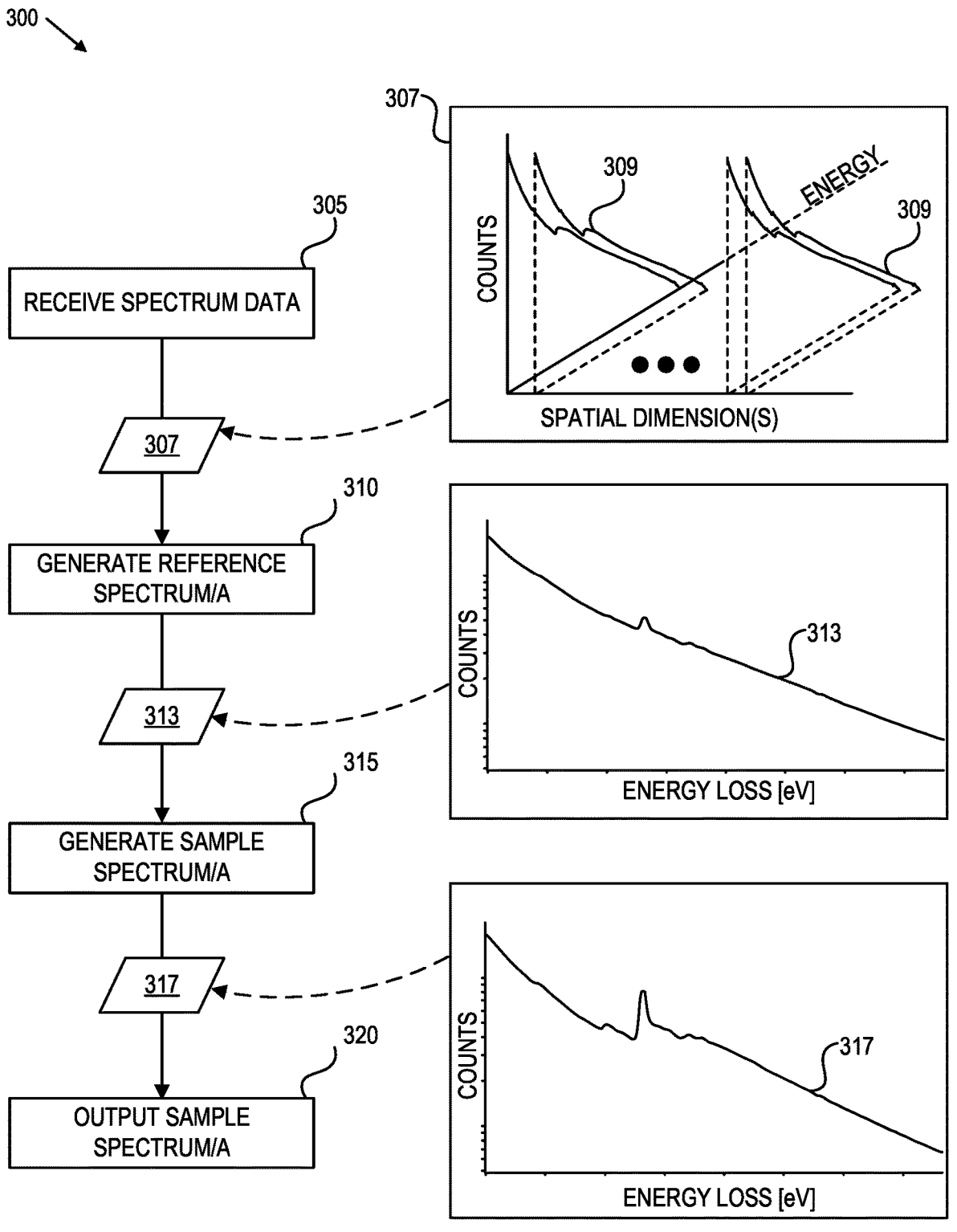
FIG. 3 is a schematic diagram illustrating an example process for processing EELS data, in accordance with some embodiments of the present disclosure.

FIG. 3 is a schematic diagram illustrating an example process 300 for augmenting EELS data, in accordance with some embodiments of the present disclosure. The example process 300 can be implemented using the example system 200 of FIG. 2 and/or applied to EELS data generated by TEM system(s) 100 of FIG. 1 (e.g., EELS data cubes as illustrated in FIG. 4). Example process 300 includes operations for receiving spectrum data 307, generating reference spectrum 313 data, generating sample spectrum 317 data, and outputting sample spectrum 317 data (e.g., as visualization data generated for presentation to a user of example system 200 via a display of computing device(s) of FIG. 2). The operations of the example process 300 are shown as a sequence of operations unassociated from a particular instrument, computing device, or machine, as an approach to illustrate a set of processes that can be used to improve performance of microanalysis techniques using charged particle microscopes. The set of processes can be implemented in a single machine (e.g., computing device) or can be distributed across more than one machine. To that end, operation(s) of the example process 300 can be omitted, repeated, reordered, and/or replaced in some embodiments.

One or more operations making up the example process 300 can be executed and/or initiated by a computer system or other machine operably coupled with components of an analytical instrument (e.g., TEM 100) and/or additional systems or subsystems including, but not limited to, characterization systems, network infrastructure, datastores, controllers, relays, power supply systems, and/or user interface devices, as described in more detail in reference to FIGS. 1-2. To that end, operations can be stored as machine executable instructions in one or more machine readable media that, when executed by the computer system, can cause the computer system to perform at least a portion of the constituent operations of process 300. The constituent operations of process 300 can be preceded by, interspersed with, and/or followed by operation(s) that are omitted from the present description, such as sample and/or instrument preparation, calibration, other operations that take place prior to operation 305 that form at least a part of an analytical method for processing and/or preparing a sample to generate spectral data 307, or one or more operations for generating spectral data 307 as illustrated in FIG. 4.

At operation 305, example process 300 includes receiving spectrum data 307. Spectrum data can include EELS data, structured as an array of EELS spectra 309 associated with a spatial region of a material sample, as described in more detail in reference to FIG. 4. Spectrum data 307 can be received from components of example system 200, such as the local system(s) 205 and/or from components of the remote system(s) 210. In an illustrative example, spectrum data 307 can be generated by TEM 100 and stored locally on IPC(s) 220 or ASM(s) 225, such that operation 305 can include receiving spectrum data 307 at a client computing device 230 from a local system 205, for example, via network(s) 215.

The spectrum data 307 can be or include one or more EELS data cubes, corresponding to one or more spatial regions and/or one or more samples. In the context of the present disclosure, a data cube can refer to data arrays that include hierarchically organized spectra including, but not limited to, spatially referenced spectra, temporally referenced spectra, energy referenced spectra, etc. As shown in the illustration associated with spectrum data 307, EELS spectra 309 can be organized in a multi-dimensional representation with one or more spatial dimensions on a first axis, energy (or energy loss) on a second axis, and counts on a third axis. In one example, the spatial dimension axis can represent a projection of two or more spatial dimensions onto a single dimension. The spectra in FIG. 3 are not reproduced to scale, but rather are intended to illustrate qualitative aspects of the different data types at different stages in example process 300.

Spectrum data 307 can be processed to generate one or more reference spectra 313 at operation 310. In some embodiments, the reference spectrum 313 or reference spectra 313 include a non-weighted average spectrum and/or can be generated using the non-weighted average spectrum (refer to FIGS. 5A-5B for non-weighted average spectrum 515). The non-weighted average spectrum, in turn, can be generated using the spectrum data 307. For example, operation 310 can include generating a non-weighted average spectrum of the EELS spectra 309 for a spatial region. Where spectrum data 307 include data cubes for multiple spatial regions, EELS spectra 309 can be grouped by spatial region to generate respective average spectra. Advantageously, generating the non-weighted average spectrum can augment the signature of an unevenly dispersed element in a sample and/or can increase the relative prominence of scattered electron information relative to zero-mean noise in spectral data 307.

Operation 310 can include operation(s) for fitting a smooth background model to the average spectrum, such that reference the reference spectrum 313 can include a fitted smooth background model. In the context of the present disclosure, a "smooth background model" refers to a physics-based heuristic model simulating a background signal generated in EELS data by TEM system 100. As an illustrative example, the smooth background model can be or include a power-law model or a sum of power-laws model with fixed and/or pre-defined exponents or with dynamic exponents used as fitting parameters (e.g., tuned as part of model fitting). An example of the latter is a sum of power laws model having an integer "N" terms, as shown below:

$$A_1 x^{a_1} + A_2 x^{a_2} + A_3 x^{a_3} + \ldots + A_N x^{a_N}$$

where the term "x" can be or include the energy. In some embodiments, coefficient $A_i$ is a fitting parameter, which can be a constant or a function, with "i" being an integer referring to the term in the power law. In some embodiments, exponent $a_i$ is a fitting parameter, which can be a negative value such that the model converges to a fit. In some embodiments, $a_i$ is a constant, equal to "−i," as shown below:

$$A_1 x^{-1} + A_2 x^{-2} + A_3 x^{-3} + \ldots + A_N x^{-N}$$

where N can be an integer equal to 1, 2, 3, 4, 5, 6, 7, 8, 9, 10, or more. Fitting techniques can include iterative minimization of an objective function (e.g., an error term) defined by the relative fit of the model to the corresponding spectrum (e.g., average spectrum, EELS spectrum 309, etc.). Advantageously, using the sum of power laws model described above improves the performance and quality of EELS data analysis techniques. For example, sum of power laws models (e.g., with constant exponents) can be fitted with a linear procedure that is relatively faster than typical model fitting techniques and converges to meaningful local optima. Further, the sum of power laws models is accurate over a relatively larger energy window than typical techniques, for example, up to and including about 1500 eV, over which a more accurate fit is provided relative to conventional single term power law models.

In some embodiments, generating the reference spectrum 313 and/or reference spectra 313 includes fitting the smooth background model to an EELS spectrum 309. For example, the spectral data 307 can include a data cube of tens, hundreds, thousands, or millions of EELS spectra 309, where operation 310 includes fitting the smooth background model to at least a subset of the tens, hundreds, or thousands of EELS spectra 309. In this way, operation 310 can include generating multiple reference spectra 313 representing fitted background models for the EELS spectra 309 making up the spectral data 307. The smooth background model can be fitted to each respective EELS spectrum 309, such that each spectrum of the data cube is associated with a respective reference spectrum 313. Advantageously, fitting individual spectra with background models improves the quality of the resulting fit and returns improved weighted spectra, for example, in spectral data 307 sets where a subset of EELS spectra 309 exert relatively little influence on an aggregate model (e.g., in a heterogeneous region of a sample).

At operation 315, example process 300 includes generating one or more sample spectra 317 using the reference spectrum 313 data generated at operation 310. The sample spectrum 317 data can represent a weighted average of the spectrum data 307. In some embodiments, a sample spectrum 317 is generated for an EELS spectrum 309, respectively. Similarly, multiple sample spectra 317 can be generated for multiple respective EELS spectra 309. Operation 315, therefore, can include generating one sample spectrum 317 for the spatial region, where the reference spectrum 313 data is generated by fitting a background model to an average spectrum for the spatial region. Additionally or alternatively, operation 315 can include generating one or more sample spectra 317 corresponding to one or more EELS spectra 309 of the spectral data 307, respectively.

To that end, operation 315 can include one or more sub-operations for determining respective weight parameters by which sample spectra 317 can be generated. Determining the respective weight parameters can include determining one or more divergence extents for EELS spectrum 309 data using reference spectrum 313 data. Where a non-weighted average spectrum of the spatial region is generated and a single reference spectrum is used, the divergence extents can include a vector of divergence values. Similarly, where multiple reference spectra 313 are generated for a subset of the EELS spectra 309 included in the spectral data 307, divergence extents can include a tensor or other data structure including multiple vectors of divergence values. In this context, the subset of EELS spectra 309 can include a single EELS spectrum 309, multiple EELS spectra 309, up to and including the complete EELS data cube for the spatial region. As such, the term "subset" can also include the full set of spectral data 307.

Divergence extents can refer to a statistical measure of the divergence of the observed spectrum in the spectral data 307 from the expected background according to the fitted background model of the reference spectrum 313 data. Divergence extents can be determined using one or more techniques, including but not limited to Kullback-Leibler, Jensen-Shannon, squared differences, absolute differences, relative squared differences, and/or relative absolute differences. Sub-operation(s) can include determining respective divergence values for at least a subset of EELS spectra 309.

Weight parameters can be used to generate the sample spectra 317, for example, by applying one or more weighting factors to spectral data 307. Weight parameters can be applied to EELS spectrum 309 data in various ways. For example, a constant weighting factor can be applied to EELS spectra 309. In another example, one or more different weighting factors can be applied to EELS spectra 309 (e.g., each respective spectrum can have a respective weighting factor). In some embodiments, the weighting factor(s) are applied to the observed spectra in proportion or otherwise informed by the difference between the relevant EELS data (e.g., average spectrum or EELS spectrum 309) and the corresponding reference spectrum 313 data, and added to the fitted background model. In this way, in regions of an EELS spectrum 309 that substantially coincide with the corresponding reference spectrum 313, the weighting factor is applied to a relatively small number (e.g., approaching zero). In contrast, in regions of an EELS spectrum 309 that include information resulting from scattering of electrons by the sample, being different from the background model, the weighting factor is applied to a relatively large number (e.g., greater than zero).

In another example, the weight parameters can depend at least in part on electron energy, such that the weighting factor is proportional to a local divergence extent of observed EELS data from expected fitted background data. In this way, weight parameters can be structured as a vector of values of length equal to the length of an EELS spectrum 309. The weight parameter can be substantially equal to or less than unity in regions of the EELS spectrum 309 that substantially overlap the fitted background model, corresponding to a divergence extent approaching zero. In contrast, the weight parameter can be larger than unity in regions of the EELS spectrum 309 that include information resulting from scattering of electrons by the sample, corresponding to a divergence extent greater than zero.

In some embodiments, a single sample spectrum 317 can be generated for the spatial region, for example, where operation 310 includes generating a reference spectrum 313 based at least in part on fitting a smooth background model to a non-weighted average spectrum using at least a portion of the spectral data 307. Such techniques can be useful to control for variations in background noise and signal strength over the spatial region. Advantageously, the generation of a single sample spectrum 317 for the spatial region can reduce the relative influence of zero-mean noise on edge-detection, elemental analysis, or the like.

Figure 5A:
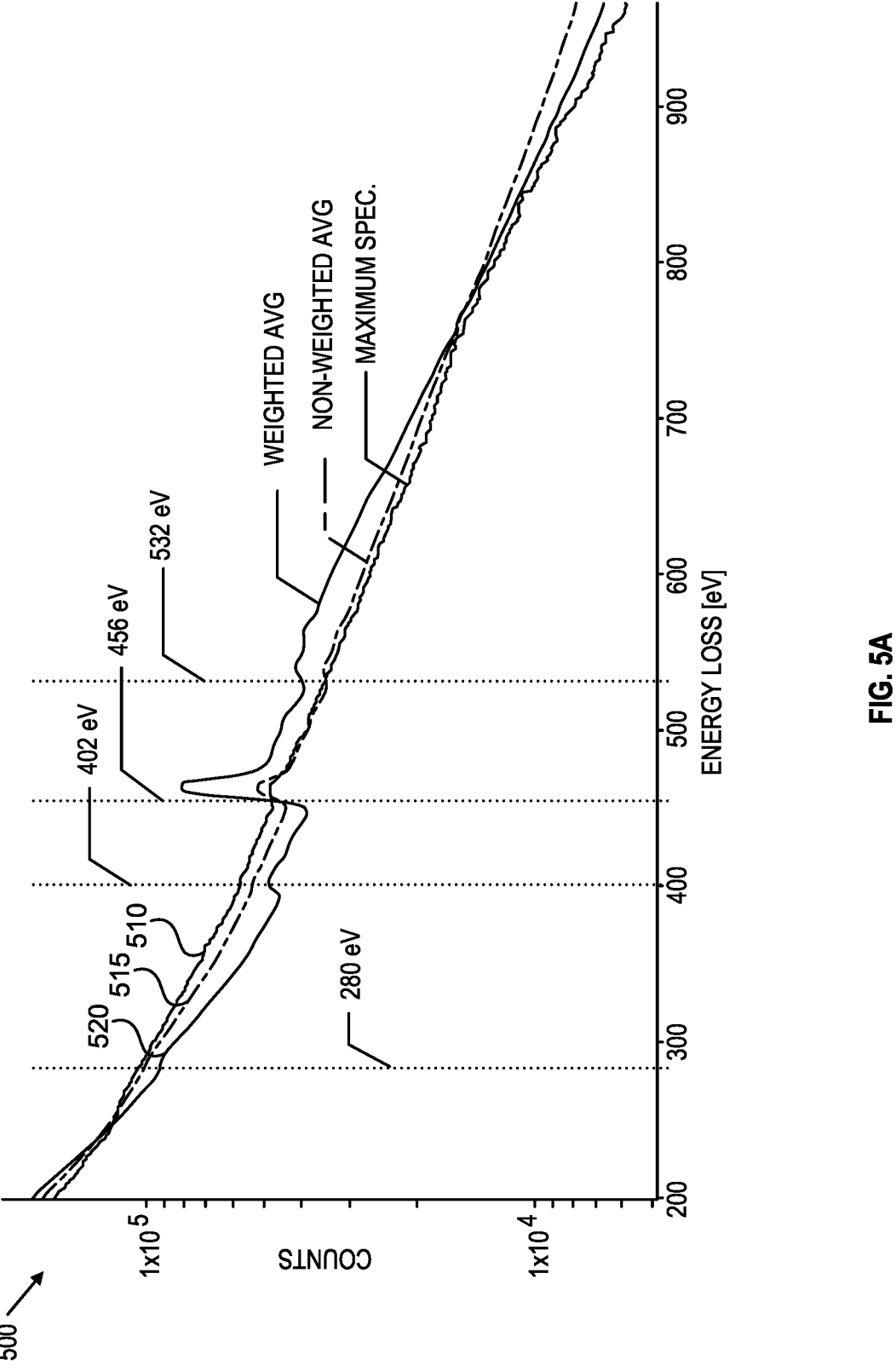
FIG. 5A is a graph of example EELS data in a range of energy loss from 200 eV to about 900 eV, in accordance with some embodiments of the present disclosure.
Figure 5B:
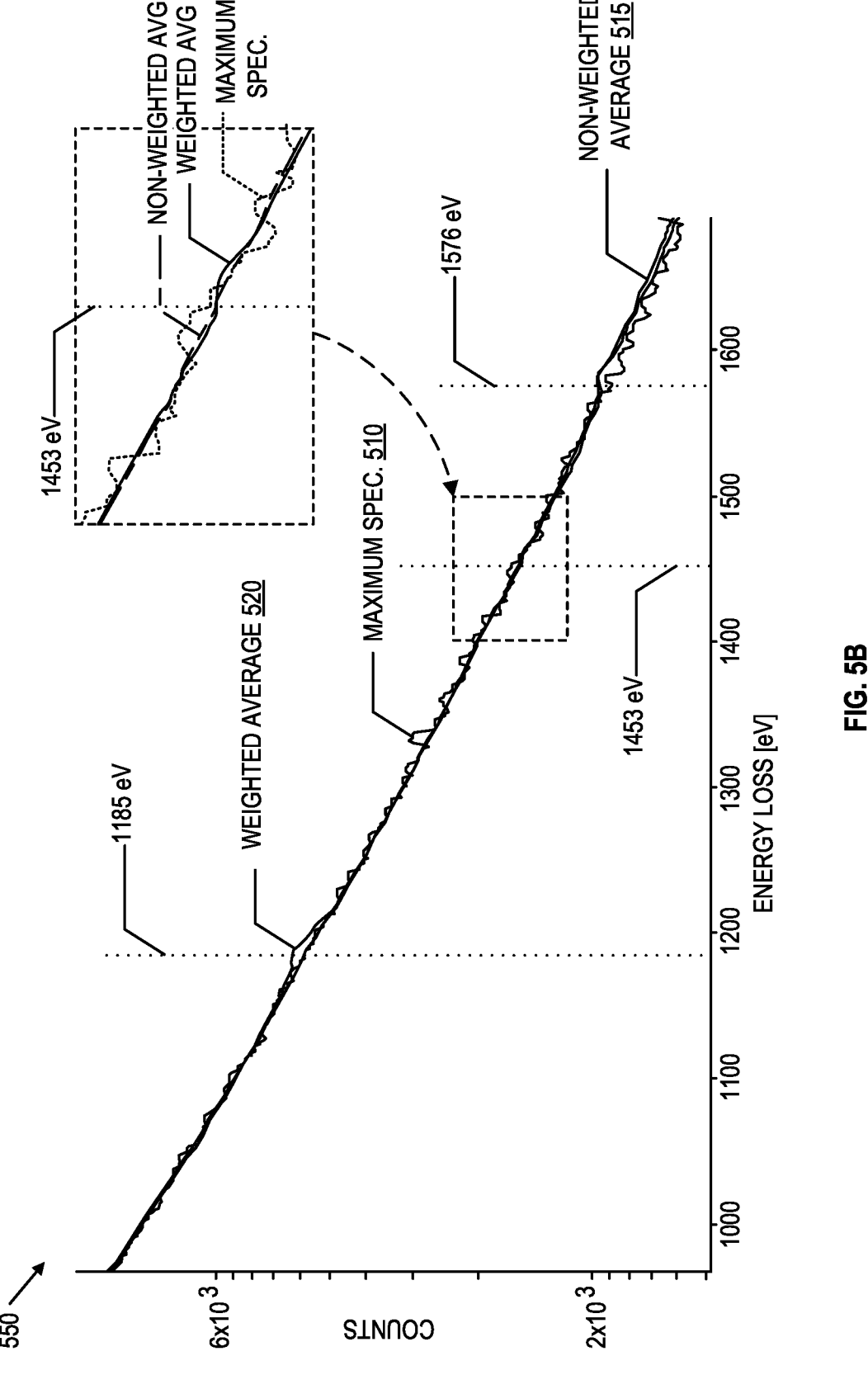
FIG. 5B is a graph of example EELS data in a range of energy loss from about 1000 eV to about 1600 eV, in accordance with some embodiments of the present disclosure.

As described in more detail in reference to FIGS. 5A-5B, conventional techniques for processing spectral data 307, such as the maximum pixel spectrum technique, tend to introduce artifacts into spectra during background removal. The maximum pixel spectrum technique uses the highest count value found in the spatial region for each energy in an energy range, and combines the maximum values into a spectrum. Maximum pixel spectrum techniques are effective for signals with relatively low-level background information, such as energy-dispersive spectroscopy (EDS). In contrast, the approach is ineffective when applied to spectral data 307 with relatively strong background, such as EELS spectra 309. The maximum pixel spectrum technique introduces noise that impairs edge-detection and other elemental analysis. For example, the noise introduced by the maximum pixel technique is typically not zero-mean noise, which limits the practicality of automated (e.g., without human intervention) or pseudo-automated (e.g., with limited human intervention to initiate and/or approve spectrum processing) noise filters (e.g., smoothing algorithms). In this way, example process 300 represents an improvement over known techniques in that the sample spectrum 317 data augments the signature of characteristic edges in EELS spectrum 309 data that would otherwise be relatively weak against the typically strong background signal found in spectral data 307. Where maximum pixel techniques return multiple false edges, and non-weighted averaging fail to detect relatively weak edges, example process 300 improves elemental analysis by augmenting the signature of relatively weak edges without also introducing artifacts.

To that end, embodiments of example process 300 also include one or more operations directed at microanalysis of the spatial region using the sample spectrum 317 data. Microanalysis operations can include spectral analysis, such as edge detection. As such, example process 300 can include operations for generating sample spectrum 317 data, using sample spectrum 317 data for elemental analysis of the spatial region (e.g., based at least in part on one or more spectral positions of one or more edges detected in sample spectrum 317 data), and outputting sample spectrum 317 data at operation 320. Further, operation 320 can include outputting sample data, including elemental data and/or sample metadata. In the context of the example process 300, outputting operations can include storing data, transferring data (e.g., between components of local systems 205, remote systems 210, and/or via networks 215 of FIG. 2), and or generating visualization, menu, and/or interface data configured to modify one or more components of example system 200 (e.g., client computing device(s) 230 or IPC(s) 220) to present the generated data. In an illustrative example, operation 320 can include generating user interface data configured to modify a display of the computing device to present the sample spectrum 317 data on the display as part of an interactive user environment. In this context, the interactive user environment can be or include one or more user-accessible menu elements, other graphical user interface elements, and/or hardware-based control interfaces through which a user may view, process, analyze, or manipulate sample spectrum 317 data.

FIG. 4 is a schematic diagram illustrating an example EELS data cube 400, in accordance with some embodiments of the present disclosure. Example EELS data cube 400 is a two-dimensional representation of a hierarchical data structure that references multi-dimensional EELS data 309 to physical locations on a sample 401 using a micrograph 405 of the sample 401. The micrograph 405 is representative of a sample prepared for TEM microanalysis, such as a patterned material fabricated by CMOS-processes. In the example of FIG. 4, the micrograph 405 represents different materials with different patterns, such that the sample shown includes a matrix of relatively dark material, which can represent an insulating or dielectric material (e.g., an oxide), and one or more relatively lighter inclusions that can be or include a conducting material (e.g., a metal or conductive oxide). The pattern shown in micrograph 405 is an illustrative example. For digital micrographs, each pixel can be referenced to a respective EELS spectrum 309. In some cases, each EELS spectrum 309 can be referenced to multiple pixels, as where the resolution of an EELS mode and the resolution of an imaging mode differ.

Spatial regions 410 and 415 are indicated on micrograph 405. Each is associated with one or more EELS spectra 309. Example graphs 420 and 425 are illustrated to provide scale examples of EELS spectra 309. Example graphs 420 and 425 include EELS data plotted on axes with energy loss (in eV) on the ordinate and counts on the abscissa. As described in more detail in reference to FIG. 3, the background intensity of example graph 420 is approximately one order of magnitude lower than that of example graph 425. As a technique, EELS can be sensitive to sample composition as well as operating parameters of the microscope. In this way, fluctuations of background signal intensity in a given sample introduces complexity in EELS data processing that makes automation challenging. For that reason, analysis of EELS data is typically performed by skilled human users (such as trained microscopists with specialized experience on TEM instruments). Advantageously, techniques of the present disclosure reduce the complexity of such analysis by improving the relative prominence of sample information in EELS data compared to background information.

FIG. 5A is a graph 500 of example EELS data in a range of energy loss from 200 eV to about 900 eV, in accordance with some embodiments of the present disclosure. The graph 500 includes energy loss (in eV) on the ordinate and counts on the abscissa, as in example graphs 420 and 425 of FIG. 4. The graph 500 includes a maximum pixel spectrum 510, a non-weighted average spectrum 515 and a weighted average spectrum 520. The spectra 510, 515, and 520 each represent EELS data that have been processed in different ways and emphasize the improvement in EELS spectral analysis afforded by the techniques described in reference to FIG. 3. The example data shown in FIG. 5A are generated for a spatial region (e.g., spatial region 410 or 415 of FIG. 4), with weighted average spectrum 520 being an example sample spectrum 317 of FIG. 3.

The maximum pixel spectrum 510 was generated using the maximum pixel spectrum technique described in more detail in reference to FIG. 3. As mentioned, the maximum pixel spectrum technique selects the highest counts value for each energy loss value in a given spatial region. In data with negligible or no spectral background, the maximum pixel spectrum technique is effective to emphasize sample information. In EELS data, however, which are characterized by strong spectral background, the maximum pixel spectrum 510 was found to make sample information relatively indistinguishable from background information and/or noise. In particular, expected sample information at approximate edge positions of 280 eV, 402 eV. 456 eV, and 532 eV was absent or significantly attenuated, relative to noise, especially at values of energy loss exceeding 500 eV.

The non-weighted average spectrum 515 includes attenuated zero-mean noise that improves the relative prominence of sample information, especially at approximately 456 eV and 532 eV. In contrast, however, the weighted average spectrum 520, prepared in accordance with example process 300, includes significantly improved sample information at each of the spectral edge positions, and similarly exhibits negligible or no zero-mean noise. Advantageously, the weighted average spectrum 520 can be more readily analyzed using spectral analysis algorithms, based at least in part on improved signal-to-noise characteristics, achieved without little or no reduction in accuracy of edge positions.

FIG. 5B is a graph 550 of example EELS data in a range of energy loss from about 1000 eV to about 1600 eV, in accordance with some embodiments of the present disclosure. As with graph 500, the graph 550 includes energy loss (in eV) on the ordinate and counts on the abscissa, as in example graphs 420 and 425 of FIG. 4. The graph 550 includes extensions of the maximum pixel spectrum 510, the non-weighted average spectrum 515, and the weighted average spectrum 520 in a higher range of energy loss values. As with the data of FIG. 5A, spectra 510, 515, and 520, reveal the improvement of the example process 300 of FIG. 3 over techniques that are ill-suited for analytical techniques exhibiting strong background information. Weighted average spectrum 520 includes sample information at edge positions of approximately 1185 eV, 1453 eV, and 1576 eV that is absent in maximum pixel spectrum 510 and non-weighted average spectrum 515.

The inset of FIG. 5B is a magnification of the energy region from about 1400 eV to about 1500 eV, provided to emphasize the improvement in sample information afforded by the techniques of the present disclosure. Where the maximum pixel spectrum 510 includes zero-mean noise that obscures the sample information at about 1453 eV, and where the non-weighted average spectrum 515 does not include appreciable sample information, the weighted average spectrum 520 includes sample information and little or no zero-mean noise. As such, the weighted average spectrum 520 can be more readily analyzed using spectral analysis algorithms. The relative improvement of the weighted average spectrum is clearer still at 1185 eV, where the weighted average spectrum 520 is visibly different from both the maximum pixel spectrum 510 and the non-weighted spectrum 515.

In the preceding description, various embodiments have been described. For purposes of explanation, specific configurations and details have been set forth to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on spectrometry systems, and electron energy loss spectroscopy (EELS) systems in particular, these are meant as non-limiting, illustrative embodiments. Embodiments of the present disclosure are not limited to such embodiments, but rather are intended to address analytical instruments systems for which a wide array of material samples can be analyzed to determine chemical, biological, physical, structural, or other properties, among other aspects, including but not limited to chemical structure, trace element composition, or the like. Examples of such systems include synchrotron systems and other spectroscopy systems that typically generate spectra including relatively strong background content.

Some embodiments of the present disclosure include a system including one or more data processors and/or logic circuits. In some embodiments, the system includes a non-transitory computer readable storage medium containing instructions which, when executed on the one or more data processors and/or logic circuits, cause the one or more data processors and/or logic circuits to perform part or all of one or more methods and/or part or all of one or more processes and workflows disclosed herein. Some embodiments of the present disclosure include a computer-program product tangibly embodied in non-transitory machine-readable storage media, including instructions configured to cause one or more data processors and/or logic circuits to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "about" or "substantially" are used to indicate a deviation from the stated property within which the deviation has little to no influence of the corresponding function, property, or attribute of the structure being described. In an illustrated example, where a dimensional parameter is described as "substantially equal" to another dimensional parameter, the term "substantially" is intended to reflect that the two parameters being compared can be unequal within a tolerable limit, such as a fabrication tolerance or a confidence interval inherent to the operation of the system. Similarly, where a geometric parameter, such as an alignment or angular orientation, is described as "about" normal, "substantially" normal, or "substantially" parallel, the terms "about" or "substantially" are intended to reflect that the alignment or angular orientation can be different from the exact stated condition (e.g., not exactly normal) within a tolerable limit. For dimensional values, such as diameters, lengths, widths, or the like, the term "about" can be understood to describe a deviation from the stated value of up to ±10%. For example, a dimension of "about 10 mm" can describe a dimension from 9 mm to 11 mm.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims. Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. A computer-implemented method for processing electron energy loss spectrum (EELS) data, the method comprising:

generating spectrum data using an electron microscope, the spectrum data being structured as an array of EELS spectra associated with a spatial region of a material sample;

generating a reference spectrum using the spectrum data;

generating a sample spectrum using the reference spectrum and the spectrum data, comprising generating a weighted average EELS spectrum of the EELS spectra, including one or more characteristic edges of the material sample; and outputting the sample spectrum.

2. The computer-implemented method of claim 1, wherein generating the reference spectrum comprises fitting a smooth background model to at least a subset of the spectrum data that includes the edge information.

3. The computer-implemented method of claim 2, wherein generating the reference spectrum comprises: generating an average spectrum of the subset of the spectrum data; and fitting the smooth background model to the average spectrum.

4. The computer-implemented method of claim 2, wherein generating the reference spectrum comprises fitting the smooth background model to an EELS spectrum of the spectrum data.

5. The computer-implemented method of claim 2, wherein the smooth background model comprises a sum of multiple power law terms.

6. The computer-implemented method of claim 5, wherein each power law term of the multiple power law terms includes a respective coefficient and a respective exponent, wherein the respective coefficient is a fitting parameter, and wherein the respective exponent is a constant.

7. The computer-implemented method of claim 1, wherein generating the sample spectrum further comprises: generating respective weight parameters for at least a subset of the EELS spectra that includes the edge information; and generating the weighted average EELS spectrum using the respective weight parameters.

8. The computer-implemented method of claim 7, wherein generating the respective weight parameters comprises determining respective divergence extents for the subset of the EELS spectra using the reference spectrum.

9. The computer-implemented method of claim 8, wherein determining the respective divergence extents comprises determining respective Kullback-Leibler divergence values or respective Jensen-Shannon divergence values for the subset of the EELS spectra.

10. The computer-implemented method of claim 1, wherein outputting the sample spectrum comprises generating visualization data using the sample spectrum, the visualization data configured to modify a display of a computing device to present the sample spectrum as part of an interactive user environment; and modifying the display using the visualization data.

11. One or more non-transitory machine-readable media storing executable instructions that, when executed by a machine, cause the machine to perform operations comprising:

generating spectrum data using an electron microscope, the spectrum data being structured as an array of EELS spectra associated with a spatial region of a material sample;

generating a reference spectrum using the spectrum data;

generating a sample spectrum using the reference spectrum and the spectrum data, comprising generating a weighted average EELS spectrum of the EELS spectra, including one or more characteristic edges of the material sample; and outputting the sample spectrum.

12. The one or more non-transitory machine-readable media of claim 11, wherein generating the reference spectrum comprises fitting a smooth background model to at least a subset of the spectrum data that includes edge information.

13. The one or more non-transitory machine-readable media of claim 12, wherein generating the reference spectrum comprises: generating an average spectrum of the subset of the spectrum data; and fitting the smooth background model to the average spectrum.

14. The one or more non-transitory machine-readable media of claim 12, wherein generating the reference spectrum comprises fitting the smooth background model to an EELS spectrum of the spectrum data.

15. The one or more non-transitory machine-readable media of claim 12, wherein the smooth background model comprises a sum of multiple power law terms, wherein each power law term of the multiple power law terms includes a respective coefficient and a respective exponent, wherein the respective coefficient is a fitting parameter, and wherein the respective exponent is a constant.

16. The one or more non-transitory machine-readable media of claim 11, wherein generating the sample spectrum comprises: generating respective weight parameters for at least a subset of the EELS spectra that includes the edge information; and generating the weighted average of the EELS spectrum using the respective weight parameters.

17. The one or more non-transitory machine-readable media of claim 16, wherein generating the respective weight parameters comprises determining respective divergence extents for the subset of the EELS spectra using the reference spectrum.

18. The one or more non-transitory machine-readable media of claim 17, wherein determining the respective divergence extents comprises determining respective absolute difference values, respective relative squared difference values, or respective relative absolute difference values for the subset of the EELS spectra.

19. A computer-implemented method for processing electron energy loss spectrum (EELS) data, the method comprising:

generating spectrum data using an electron microscope, the spectrum data being structured as an array of EELS spectra associated with a spatial region of a material sample;

generating a reference spectrum using the spectrum data;

generating a sample spectrum using the reference spectrum and the spectrum data, wherein the sample spectrum comprises a weighted average EELS spectrum, including edge information characteristic of the material sample, wherein generating the sample spectrum comprises: generating respective weight parameters for at least a subset of the EELS spectra that includes the edge information; and generating the weighted average spectrum using the respective weight parameters; and outputting the sample spectrum.

20. The computer-implemented method of claim 19, further comprising:

generating deconvolution data using the edge information, the deconvolution data describing a composition of the material sample in the spatial region; and generating visualization data using the sample spectrum and the deconvolution data, the visualization data configured to modify a display of a computing device to present the sample spectrum as part of an interactive user environment; and modifying the display using the visualization data.

* * * * *